(12) United States Patent
Yazawa et al.

(10) Patent No.: US 9,752,958 B2
(45) Date of Patent: Sep. 5, 2017

(54) LOAD DRIVE APPARATUS AND SENSOR CONTROL APPARATUS

(71) Applicant: NGK SPARK PLUG CO., LTD., Nagoya-shi, Aichi (JP)

(72) Inventors: Katsunori Yazawa, Kasugai (JP); Yoshinori Inoue, Nagoya (JP)

(73) Assignee: NGK SPARK PLUG CO., LTD., Aichi (JP)

( * ) Notice: Subject to any disclaimer, the term of this patent is extended or adjusted under 35 U.S.C. 154(b) by 255 days.

(21) Appl. No.: 14/481,210

(22) Filed: Sep. 9, 2014

(65) Prior Publication Data

US 2015/0068278 A1 Mar. 12, 2015

(30) Foreign Application Priority Data

Sep. 10, 2013 (JP) ................. 2013-187232

(51) Int. Cl.
*G01M 15/10* (2006.01)
*G01R 31/02* (2006.01)
(Continued)

(52) U.S. Cl.
CPC ........... *G01M 15/104* (2013.01); *F01N 11/00* (2013.01); *F02D 41/221* (2013.01);
(Continued)

(58) Field of Classification Search
USPC ........ 324/543, 509, 537; 73/23.32; 323/271, 323/284, 277, 282; 327/108, 540;
(Continued)

(56) References Cited

U.S. PATENT DOCUMENTS 5,327,780 A 7/1994 Entenmann et al.
5,970,785 A * 10/1999 Giorgetta ............ F02D 41/1494
73/114.73
(Continued)

FOREIGN PATENT DOCUMENTS

JP 5-195843 A 8/1993
JP H08-327586 A 12/1996
(Continued)

OTHER PUBLICATIONS

Communication dated Mar. 7, 2017, from the Japanese Patent Office in counterpart application No. 2013-187232.

*Primary Examiner* — Farhana Hoque
*Assistant Examiner* — Nasima Monsur
(74) *Attorney, Agent, or Firm* — Sughrue Mion, PLLC (57) ABSTRACT

A load drive apparatus (1) includes a pulse drive circuit (51) which applies a pulse voltage PS to a resistive load (4); current detection means (S14) for detecting the current flowing to the resistive load (4) through the pulse drive circuit (51); level detection means (S1, S7) for determining whether an output terminal voltage VD of the pulse drive circuit (51) is a high potential level or a low potential level; anomaly detection means (S8, S9, S18) for detecting a wire breakage anomaly, a short-to-power anomaly, and a short-to-ground anomaly based on the level of the output terminal voltage VD detected by the level detection means (S1, S7) and the current detected by the current detection means (S14), when the pulse drive circuit 51 is turned on and off.

6 Claims, 4 Drawing Sheets

(51) Int. Cl.
*F01N 11/00* (2006.01)
*F02D 41/22* (2006.01)
*F02P 19/02* (2006.01)
*H02M 3/156* (2006.01)
*G01R 31/40* (2014.01)

(52) U.S. Cl.
CPC .......... *F02D 41/222* (2013.01); *F02P 19/022* (2013.01); *F02P 19/027* (2013.01); *G01R 31/024* (2013.01); *F01N 2550/00* (2013.01); *F01N 2560/025* (2013.01); *F01N 2560/20* (2013.01); *F01N 2900/0602* (2013.01); *G01R 31/40* (2013.01); *H02M 3/156* (2013.01); *Y02T 10/40* (2013.01); *Y02T 10/47* (2013.01)

(58) Field of Classification Search
USPC .................... 361/87, 88; 363/21.1; 701/29.2; 204/401
See application file for complete search history.

(56) References Cited

U.S. PATENT DOCUMENTS

| | | | |
|---|---|---|---|
| 2004/0222094 A1* | 11/2004 | Ieda .................... | G01N 27/4175 204/424 |
| 2010/0067161 A1* | 3/2010 | Nakajima .......... | H03K 17/0822 361/100 |
| 2010/0133116 A1* | 6/2010 | Ieda ..................... | G01N 27/407 205/775 |
| 2012/0001641 A1* | 1/2012 | Tsukada ............... | G01N 27/407 324/537 |

FOREIGN PATENT DOCUMENTS

| | | |
|---|---|---|
| JP | 2002-295299 A | 10/2002 |
| JP | 2003-097323 A | 4/2003 |
| JP | 2008-261267 A | 10/2008 |
| JP | 2010-160011 A | 7/2010 |

\* cited by examiner

LOAD DRIVE APPARATUS AND SENSOR CONTROL APPARATUS

BACKGROUND OF THE INVENTION

1. Field of the Invention

The present invention relates to a load drive apparatus having a pulse drive circuit which repeatedly applies a pulse voltage to a resistive load, and to a sensor control apparatus including the load drive apparatus.

2. Description of the Related Art

Conventionally, a load drive apparatus which drives a resistive load such as a heater for heating a detection element of an oxygen sensor mainly composed of, for example, solid electrolyte such as zirconia includes a pulse drive circuit. One end of the resistive load is grounded, and the output terminal of the pulse drive circuit is connected to the other end of the resistive load. The pulse drive circuit repeatedly applies a pulse voltage to the resistive load. In such a load drive apparatus, the connection path between the pulse drive circuit and the resistive load may suffer a connection anomaly such as formation of a short circuit to the power supply potential or the ground potential or a break in the connection path.

Therefore, preferably, the load drive apparatus is able to properly detect the occurrence of such a connection anomaly.

For example, Patent Document 1 discloses a method and an apparatus for monitoring the operability of a heater of an oxygen measurement sensor. The apparatus and method are configured to measure the power supply voltage of the heater when the heater is operated and when the heater is stopped, and to output a corresponding fault signal when the voltage difference becomes less than a predetermined minimum value or when the voltage difference becomes greater than a predetermined maximum value.

The above-mentioned method and apparatus are based on the principle that the power supply voltage of the heater drops when the heater is operated (energized). Thus, the power supply voltage of the heater is measured when the heater is operated (energized) and when the heater is stopped (de-energized), and the state of a failure (wire breakage or short circuit) is diagnosed based on the measured voltage. Specifically, when a predetermined diagnosis condition is satisfied after waiting, the power supply voltage Uon of the heater is measured when the heater is operated (energized). After that, when the heater is stopped (de-energized), the power supply voltage Uoff of the heater is measured. In the case where the difference between Uoff and Uon is not greater than a minimum value $\Delta U1$, a wire breakage is determined to have occurred in the heater. In the case where the difference between Uoff and Uon exceeds a maximum value $\Delta U2$, a determination is made that the heater has been short-circuited. The diagnosis is also repeated when other diagnostic conditions are satisfied.

[Patent Document 1] Japanese Patent Application Laid-Open (kokai) No. H5-195843

PROBLEMS TO BE SOLVED BY THE INVENTION

The short circuiting of the heater which can be detected by the above-described method and apparatus is limited to detecting a short circuit to ground. Meanwhile, short circuiting includes not only the shorting to ground but also short circuiting of the connection path to a power supply potential (shorting to power). However, in the above-described method and apparatus, detection of such shorting to power is not taken into consideration, and three types of connection anomalies; i.e., wire breakage anomaly, short-to-power anomaly, and short-to-ground anomaly, cannot be detected properly. Also, the above-described method and apparatus perform the diagnosis for determining the state of a failure (wire breakage or short circuit) by energizing and de-energizing the heater when a predetermined diagnosis condition is satisfied. According to the description of Patent Document 1, detection of connection anomalies is not performed simultaneously with ordinary energization of the heater.

SUMMARY OF THE INVENTION

The present invention was made in order to solve the above-mentioned problems, and an object thereof is to provide a load drive apparatus which includes a pulse drive circuit for repeatedly applying a pulse voltage to a resistive load and which can properly detect a connection anomaly occurring in a connection path connecting the pulse drive circuit and the resistive load. Another objet of the present invention is to provide a sensor control apparatus including the above load drive apparatus.

The above objects of the present invention have been achieved by providing, in a first aspect (1), a load drive apparatus comprising: a pulse drive circuit which has an output terminal connected to a second end of a resistive load whose first end is grounded, the pulse drive circuit being disposed between the resistive load and a power supply, the pulse drive circuit repeatedly applying a pulse voltage to the resistive load by repeatedly turning the pulse drive circuit on and off; current detection means for detecting a current flowing from the power supply to the resistive load through the pulse drive circuit when the pulse drive circuit turns on; level detection means for determining whether an output terminal voltage at the output terminal of the pulse drive circuit is at a high potential level or a low potential level; and anomaly detection means for detecting a wire breakage anomaly, a short-to-power anomaly, and a short-to-ground anomaly based on the level of the output terminal voltage detected by the level detection means and the current detected by the current detection means when the pulse drive circuit is turned on and off, the wire breakage anomaly being an anomaly in which at least one of a first connection path which connects the output terminal of the pulse drive circuit and the second end of the resistive load and a second connection path which grounds the first end of the resistive load is broken, the short-to-power anomaly being an anomaly in which the first connection path is short-circuited to a power supply potential, and the short-to-ground anomaly being an anomaly in which the first connection path is short-circuited to a ground potential.

This load drive apparatus includes not only a so-called high-side-type pulse drive circuit disposed between a resistive load and a power supply, but also current detection means and level detection means. In a normal state, when the high-side-type pulse drive circuit is turned on, the output terminal voltage at the output terminal of the pulse drive circuit assumes a high potential level approximately equal to a power supply potential ($\cong$ the power supply potential). Meanwhile, when the pulse drive circuit is turned off, the output terminal voltage becomes a low potential level approximately equal to a ground potential ($\cong$ the ground potential). The level detection means determines whether the output terminal voltage is at a high potential level ($\cong$ the power supply potential) or at a low potential level ($\cong$ the ground potential). An example of the level detection means is means for measuring the potential of the output terminal voltage through A/D conversion, and determining whether the output terminal voltage is at the high potential level or the low potential level by using the measured value. Another example of the level detection means is means for converting the output terminal voltage to a binary value which changes between high and lower levels using a level conversion circuit, inputting the binary value to a digital input port of a microprocessor, and determining whether the output terminal voltage is at the high potential level or the low potential level.

The current detection means detects the current flowing to the resistive load through the pulse drive circuit when the pulse drive circuit is turned on. An example of the current detection means is means for detecting the current flowing to the resistive load from a voltage drop across a current detection resistor connected in series to the resistive load. Another example of the current detection means is means for detecting the current flowing through the pulse drive circuit instead of directly detecting the current flowing to the resistive load.

In the load drive apparatus, when the pulse drive circuit is turned on and off, the anomaly detection means detects three types of connection anomalies (a wire breakage anomaly, a short-to-power anomaly, and a short-to-ground anomaly) of the connection path connecting the pulse drive circuit and the resistive load based on the level of the output terminal voltage detected by the level detection means and the current detected by the current detection means. Namely, in this load drive apparatus, the response of the output terminal voltage when the pulse drive circuit is turned on and off is detected by the level detection means, and the current flowing to the resistive load when the pulse drive circuit is turned on is detected by the current detection means. Thus, the three types of connection anomalies can be detected properly through use of the response of the output terminal voltage and the current flowing to the resistive load.

Although a drive circuit configured by a discrete switching device such as a power MOS-FET or an IGBT may be used as the pulse drive circuit, an IPD (Intelligent Power Device) in which a switching device, a drive circuit for the switching device, a protection circuit, etc., are integrated may be used as the pulse drive circuit. When an IPD having a current sensing function of detecting the current flowing through the switching device is used, the current sensing function of the IPD can be used as the current detection means.

As a result, the anomaly detection means can be realized by a simple configuration.

In a preferred embodiment (2) of the load drive apparatus (1) above, the anomaly detection means includes wire-breakage determination means for determining that a wire breakage anomaly has occurred, when the level of the output terminal voltage changes between the high potential level and the low potential level as a result of turning the pulse drive circuit on and off, and the current flowing to the resistive load detected by the current detection means when the pulse drive circuit is turned on is smaller than a predetermined lower limit current value; short-to-power determination means for determining that a short-to-power anomaly has occurred, when the level of the output terminal voltage remains at the high potential level irrespective of turning the pulse drive circuit on and off; and short-to-ground determination means for determining that a short-to-ground anomaly has occurred, when the level of the output terminal voltage remains at the low potential level irrespective of turning the pulse drive circuit on and off.

In this load drive apparatus, the wire-breakage determination means determines whether a wire breakage anomaly has occurred, the short-to-power determination means determines whether a short-to-power anomaly has occurred, and the short-to-ground determination means determines whether a short-to-ground anomaly has occurred.

Specifically, a wire breakage anomaly is determined to have occurred, when the level of the output terminal voltage changes between the high potential level (≅the power supply potential) and the low potential level (≅the ground potential) as a result of turning the pulse drive circuit on and off, and the current flowing to the resistive load when the pulse drive circuit turns on is smaller than a predetermined lower limit current value; namely, current hardly flows to the resistive load.

Also, a short-to-power anomaly is determined to have occurred, when the level of the output terminal voltage remains at the high potential level; i.e., the output terminal voltage is fixed to the high potential level (≅the power supply potential), even when the pulse drive circuit is turned on and off.

Further, a short-to-ground anomaly is determined to have occurred, when the level of the output terminal voltage remains at the low potential level; i.e., the output terminal voltage is fixed to the low potential level (≅the ground potential), even when the pulse drive circuit is turned on and off.

As a result, a wire breakage anomaly, a short-to-power anomaly, and a short-to-ground anomaly can be determined easily and accurately, whereby the three types of connection anomalies can be detected properly.

In another preferred embodiment (3) of the load drive apparatus (1) or (2) above, the anomaly detection means comprises energization period anomaly detection means for detecting a wire breakage anomaly, a short-to-power anomaly, and a short-to-ground anomaly by turning the pulse drive circuit on and off during a pulse energization period during which the pulse voltage is repeatedly applied to the resistive load.

In this load drive apparatus, the three types of connection anomalies (wire breakage anomaly, short-to-power anomaly, and short-to-ground anomaly) are detected by turning the pulse drive circuit on and off while performing pulse energization. Therefore, it is unnecessary to separately perform energization dedicated for detection of the connection anomalies. In addition, it is possible to detect connection anomalies at an early stage during an ordinary period during which the resistive load is energized by applying pulses thereto, without interrupting the energization.

Notably, in the case where the connection anomalies are detected by turning the pulse drive circuit on and off while performing pulse energization, a duty ratio of the pulse voltage applied to the resistive load is preferably set to a lower limit of greater than 0% and an upper limit of smaller than 100% to thereby prevent the duty ratio from becoming 0% or 100% during the period of the pulse energization (the pulse energization period). Thus, detection of connection anomalies becomes possible at all times irrespective of the duty ratio in the pulse energization period.

In yet another preferred embodiment (4), the load drive apparatus of any of (1) to (3) above further comprises energization stoppage means for stopping the supply of electric current to the resistive load by the pulse drive circuit when the anomaly detection means detects any of a wire breakage anomaly, a short-to-power anomaly, and a short-to-ground anomaly.

In this load drive apparatus, the supply of electric current to the resistive load by the pulse drive circuit is stopped when the connection path connected to the resistive load suffers a connection anomaly; i.e., a wire breakage anomaly, a short-to-power anomaly, or a short-to-ground anomaly.

Since the supply of electric current to the resistive load is not continued in a state in which a connection anomaly has occurred, breakage of the pulse drive circuit and the resistive load can be prevented.

In a second aspect (5), the present invention provides a sensor control apparatus which comprises the load drive apparatus (4) above, the sensor control apparatus controlling a sensor including a heater which is the resistive load and which generates heat when energized by the load drive apparatus and a detection element formed of solid electrolyte and heated by the heater. The sensor control apparatus comprises an element drive circuit for driving the detection element of the sensor; and element drive stoppage means for stopping the drive of the detection element by the element drive circuit when the anomaly detection means of the load drive apparatus detects any of a wire breakage anomaly, a short-to-power anomaly, and a short-to-ground anomaly.

This sensor control apparatus includes the above-described load drive apparatus including the energization stoppage means, and controls a sensor including a heater and a detection element. Also, the sensor control apparatus includes an element drive circuit for driving the detection element of the sensor, and element drive stoppage means for stopping the drive of the detection element by the element drive circuit.

Therefore, a situation can be avoided in which the detection element of the sensor becomes anomalous as a result of the detection element of the sensor being continuously driven in a state in which the detection element is not heated properly.

In a preferred embodiment (6) of the sensor control apparatus (5) above, the sensor is a gas sensor which has, as the detection element, a gas detection element including a pump cell which is formed of an oxygen-ion-conductive solid electrolyte and pumps oxygen into or out of a measurement chamber of the gas detection element in accordance with a pump current flowing through the pump cell; the element drive circuit includes a pump current control circuit for supplying the pump current to the pump cell; and the element drive stoppage means includes pump current stoppage means for causing the pump current control circuit to stop the supply of the pump current to the pump cell.

This sensor control apparatus controls a gas sensor having a gas detection element including a pump cell.

As described above, when a connection anomaly occurs, the load drive apparatus stops the supply of electric current to the heater. Therefore, the temperature of the gas detection element of the gas sensor decreases, and the gas detection element enters a non-active state. If the pumping of oxygen by the pump cell is performed by continuing the supply of the pump current to the pump cell in such a non-active state, the solid electrolyte of the pump cell is electrolyzed, whereby so-called blackening may occur.

In contrast, in the sensor control apparatus, when a connection anomaly is detected, the pump current stoppage means causes the pump current control circuit to stop the supply of pump current to the pump cell. Therefore, the supply of pump current to the pump cell in a non-active state is not continued, whereby blackening of the pump cell can be avoided.

DESCRIPTION OF REFERENCE NUMERALS

Reference numerals used to identify various features in the drawings include the following.

1: gas sensor control apparatus (sensor control apparatus, load drive apparatus)
2: gas sensor (sensor)
3: sensor element section (detection element, gas detection element)
4: heater (resistive load)
4N: heater terminal (first end)
4P: heater terminal (second end)
14: pump cell
24: electromotive force cell
Ip: pump current
Rpvs: element resistance
40: sensor element section control circuit (element drive circuit)
47: pump current control circuit
50: heater control circuit
51: heater driver (pulse drive circuit)
51d: current sensing circuit (current detection means)
52: output terminal
53: ground terminal
54: lead wire (first connection path)
55: lead wire (second connection path)
57: level conversion circuit (level detection means)
Rs: current sensing resistor (current detection means)
R2: resistor (current detection means)
70: microprocessor
74: PWM output port
75: A/D input port (current detection means)
76: digital input port (level detection means)
BT: power supply (battery)
VB: power supply potential
GND: ground potential
VD: output terminal voltage
PS: pulse voltage
S1, S7: level detection means
S14: current detection means
S8: short-to-ground determination means (anomaly detection means, energization period anomaly detection means)
S9: short-to-power determination means (anomaly detection means, energization period anomaly detection means)
S18: wire-breakage determination means (anomaly detection means, energization period anomaly detection means)
S10: energization stoppage means S11: element drive stoppage means, pump current stoppage means

DETAILED DESCRIPTION OF THE PREFERRED EMBODIMENTS

An embodiment of the present invention will now be described with reference to the drawings. However, the present invention should be not construed as being limited thereto.

Figure 1:
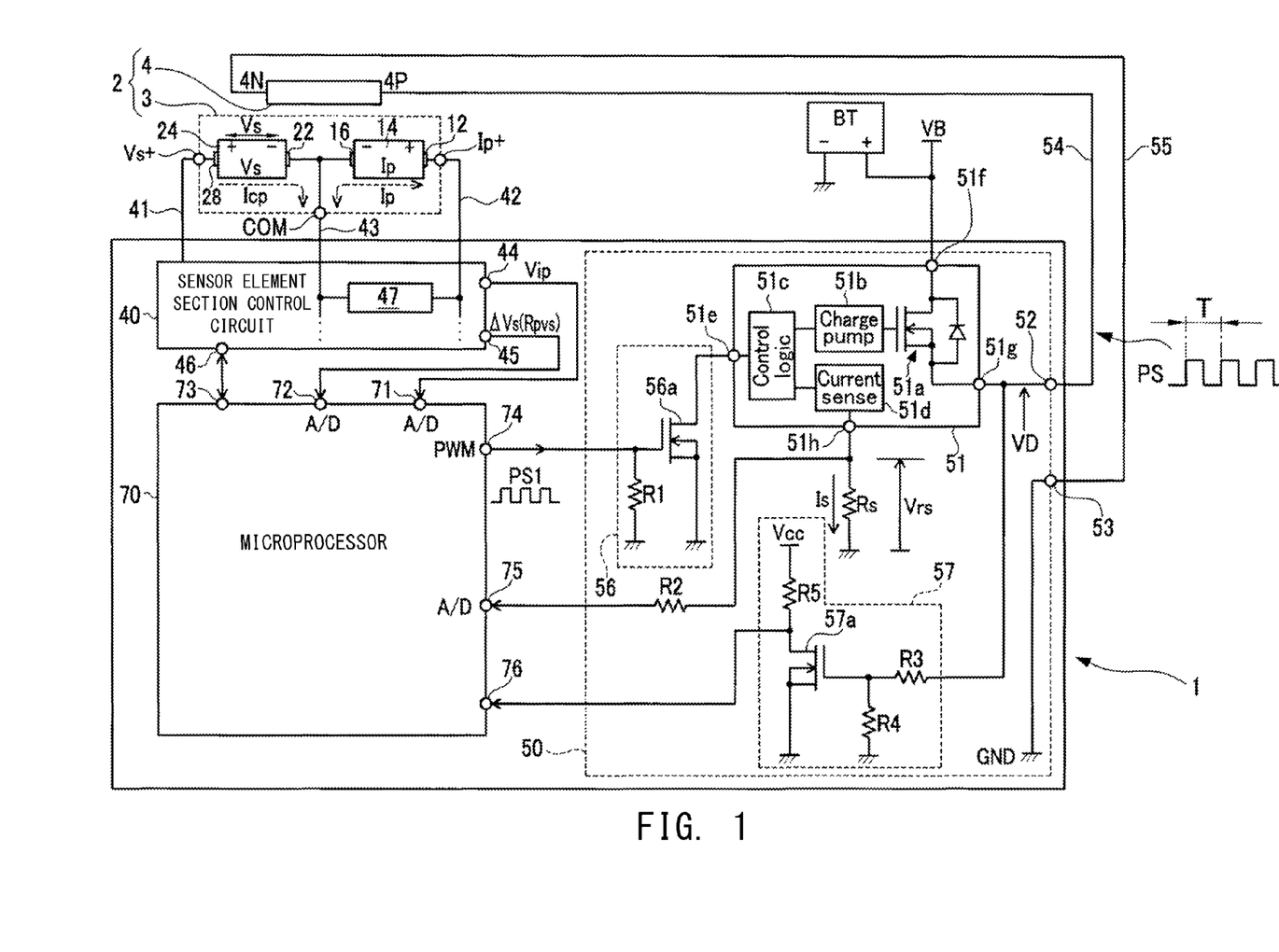
FIG. 1 is an explanatory diagram schematically showing the configuration of a gas sensor control apparatus according to an embodiment.

FIG. 1 is a diagram schematically showing the configuration of a gas sensor control apparatus 1 which is a sensor control apparatus according to the present embodiment. The gas sensor control apparatus 1 includes a microprocessor 70, a sensor element section control circuit 40, and a heater control circuit 50. The gas sensor control apparatus 1 is connected to and controls a gas sensor 2. The gas sensor 2 is a known air-fuel-ratio sensor (full-range oxygen sensor) which is attached to an exhaust pipe of an internal combustion engine of an unillustrated vehicle and which detects the oxygen concentration of exhaust gas (air-fuel ratio) to be used for air-fuel-ratio feedback control of the internal combustion engine. The gas sensor 2 includes a sensor element section 3 for detecting the oxygen concentration, and a heater 4 for heating the sensor element section 3.

In the present embodiment, the gas sensor 2 corresponds to the sensor of the invention; the heater 4 of the gas sensor 2 corresponds to the resistive load of the invention. The sensor element section 3 of the gas sensor 2 corresponds to the detection element and the gas detection element of the invention. The gas sensor control apparatus 1 includes a load drive apparatus which supplies electric current to the heater 4 (resistive load) of the gas sensor 2, and the microprocessor 70 and the heater control circuit 50 correspond to this load drive apparatus.

The sensor element section 3 of the gas sensor 2 has a known structure in which a pump cell 14 and an electromotive force cell 24 are stacked via a spacer constituting a hollow measurement chamber (not shown) into which exhaust gas can be introduced, and an electrode located on one side of the electromotive force cell 24 opposite the measurement chamber is covered with a protection layer (not shown). Each of the pump cell 14 and the electromotive force cell 24 includes, as a substrate, a platelike, oxygen-ion-conductive solid electrolyte body mainly made of zirconia, and porous platinum electrodes 12, 16 and 22, 28 formed on opposite sides of the substrate. The electrode 16 of the pump cell 14 and the electrode 22 of the electromotive force cell 24 are electrically connected to each other and are connected to a terminal COM of the sensor element section 3. The electrode 12 of the pump cell 14 is connected to a terminal Ip+ of the sensor element section 3, and the electrode 28 of the electromotive force cell 24 is connected to a terminal Vs+ of the sensor element section 3.

The sensor element section 3 is connected to the sensor element section control circuit 40 of the gas sensor control apparatus 1 through three lead wires 41, 42, and 43 connected to the terminals Vs+, Ip+, and COM, respectively. The sensor element section control circuit 40 is an element drive circuit for driving the sensor element section 3, and is mainly composed of an ASIC (Application Specific Integrated Circuit). The sensor element section control circuit 40 includes a pump current control circuit 47 which supplies a pump current Ip to the pump cell 14. In a state in which a very small current Icp is supplied to the electromotive force cell 24 of the sensor element section 3, the pump cell current Ip flowing through the pump cell 14 is controlled by the pump current control circuit 47 such that the electromotive force cell voltage Vs generated between the opposite ends of the electromotive force cell 24 becomes 450 mV. Thus, oxygen contained in the exhaust gas introduced into the measurement chamber is pumped out or oxygen is pumped into the measurement chamber. Since the magnitude and flow direction of the pump current Ip flowing through the pump cell 14 change depending on the oxygen concentration of the exhaust gas (air-fuel ratio), the oxygen concentration of exhaust gas can be calculated on the basis of the pump current Ip.

In the sensor element section control circuit 40, the magnitude of the pump cell current Ip is converted to an analog voltage signal, which is detected as a gas detection signal Vip and is output from an output terminal 44. Also, the sensor element section control circuit 40 has a function of detecting a voltage change amount $\Delta Vs$ which changes in accordance with the element resistance Rpvs of the electromotive force cell 24 of the sensor element section 3. A serial transmission port 73 of the microprocessor 70 is connected to a command reception port 46 of the sensor element section control circuit 40. In response to an instruction from the microprocessor 70, the sensor element section control circuit 40 supplies a constant current (current pulse) to the electromotive force cell 24, detects the instantaneous voltage change amount $\Delta Vs$, and outputs it from an output terminal 45. The microprocessor 70 receives the gas detection signal Vip and the voltage change amount $\Delta Vs$ through A/D input ports 71 and 72.

The microprocessor 70 calculates the element resistance Rpvs of the electromotive force cell 24 from the voltage change amount $\Delta Vs$, and feedback-controls the energization of the heater section 4 of the gas sensor 2 through the heater control circuit 50, which will be described next, such that the calculated element resistance Rpvs becomes equal to a target resistance. The circuit configuration and operation of the sensor element section control circuit 40 for detecting the gas detection signal Vip and the voltage change amount $\Delta Vs$ are disclosed, for example, in U.S. Publication Nos. US 2007/0056860 and US 2011/0199709, incorporated herein by reference, and are well known. Therefore, the details thereof will not be described here.

Next, the heater control circuit 50 will be described. This heater control circuit 50 includes, in addition to a heater driver 51 corresponding to the pulse drive circuit of the invention, a pre-stage driver circuit 56, a level conversion circuit 57, a current sensing resistor Rs, etc. The heater control circuit 50 is used to drive the heater 4.

A heater terminal 4N at one end of the heater 4 is connected to a ground terminal 53 of the heater control circuit 50 through a lead wire 55, and this ground terminal 53 is grounded to a ground potential GND inside the heater control circuit 50. A heater terminal 4P at the other end of the heater 4 is connected to an output terminal 52 of the heater control circuit 50 through a lead wire 54. This output terminal 52 is connected to an output terminal 51g of the heater driver 51, which will be described next, inside the heater control circuit 50.

The heater driver 51 is a high-side-type IPD (Intelligent Power Device), and includes an N-channel power MOS-FET 51a (hereinafter referred to as the FET 51a) and a charge pump circuit 51b for producing a gate voltage for the FET 51a. The heater driver 51 also includes a control logic circuit 51c and a current sensing circuit 51d. The heater driver 51 includes four terminals; i.e., an input terminal 51e, a power supply terminal 51f, an output terminal 51g, and a sensed current output terminal 51h, which are connected to the control logic circuit 51c, the drain of the FET 51a, the source of the FET 51a, and the current sensing circuit 51d, respectively, inside the heater driver 51.

As described above, the output terminal 51g of the heater driver 51 is connected to the output terminal 52 of the heater control circuit 50, and the power supply terminal 51f is connected to the positive terminal of a power supply BT (battery) which outputs a power supply potential VB.

The input terminal 51e of the heater driver 51 is connected to a PWM (pulse width modulated) output port 74 of the microprocessor 70 through the pre-stage driver circuit 56. The pre-stage driver circuit 56 includes an FET 56a and a resistor R1 for pull-down connection of the gate of the FET 56a to the ground potential GND. The PWM output port 74 of the microprocessor 70 is connected to the gate of the FET 56a. The source of the FET 56a is grounded to the ground potential GND, and the drain of the FET 56a is connected to the input terminal 51e of the heater driver 51.

When a high level signal is output from the PWM output port 74 of the microprocessor 70, the FET 56a of the pre-stage driver circuit 56 turns on, and the input terminal 51e of the heater driver 51 is connected to the ground potential GND. As a result, the FET 51a of the heater driver 51 turns on. Meanwhile, when a low level signal is output from the PWM output port 74 of the microprocessor 70, the FET 56a of the pre-stage driver circuit 56 turns off, and the input terminal 51e of the heater driver 51 is disconnected from the ground potential GND. As a result, the FET 51a of the heater driver 51 turns off.

The microprocessor 70 outputs from the PWM output port 74 a PWM pulse signal PS1 whose level repeatedly changes between high and low levels, to thereby turn the FET 51a of the heater driver 51 on and off. As a result, a repetitive pulse voltage PS obtained from the power supply potential VB through PWM switching is applied to the heater 4 connected between the output terminal 52 and the ground terminal 53 of the heater control circuit 50. In the present embodiment, the repetition period T of the PWM pulse signal PS1 and the pulse voltage PS is set to 10 msec.

Outside the heater driver 51, the sensed current output terminal 51h connected to the current sensing circuit 51d of the heater driver 51 is connected to the ground potential GND through a current sensing resistor Rs, and is connected to an A/D input port 75 of the microprocessor 70 through a resistor R2. As a result, the current flowing through the FET 51a when the FET 51a of the heater driver 51 turns on is detected by the current sensing circuit 51d, and a sensing current Is corresponding thereto flows through the external current sensing resistor Rs. The microprocessor 70 detects a voltage drop Vrs (=Rs×Is) across the current sensing resistor Rs and converts it to a digital value. Therefore, it is possible to detect the magnitude of the current flowing through the FET 51a; i.e., the current flowing to the heater 4 through the FET 51a in a normal state.

Further, the output terminal 51g of the heater driver 51 is connected to the output terminal 52 of the heater control circuit 50, and is connected to a digital input port 76 of the microprocessor 70 through a level conversion circuit 57. The level conversion circuit 57 includes an FET 57a and resistors R3-R5. An output terminal voltage VD at the output terminal 51g of the heater driver 51 (the output terminal 52) is divided by the resistor R3 and the resistor R4, and a voltage produced as a result of the voltage division is input to the gate of the FET 57a. The source of the FET 57a is connected to the ground potential GND, and the drain of the FET 57a is connected to a control power supply Vcc through a resistor R5 (pull-up connection), and is connected to the digital input port 76 of the microprocessor 70. When the FET 51a of the heater driver 51 turns on, in a normal state, current flows through the heater 4, and the output terminal voltage VD assumes a high potential level approximately equal to the power supply potential VB (≅the power supply potential VB). As a result, the FET 57a of the level conversion circuit 57 turns on, and a low level signal is input to the digital input port 76 of the microprocessor 70. Meanwhile, when the FET 51a of the heater driver 51 turns off, in a normal state, the current flowing to the heater 4 is interrupted, and the output terminal voltage VD assumes a low potential level approximately equal to the ground potential GND (≅the ground potential GND). As a result, the FET 57a of the level conversion circuit 57 turns off, and a high level signal is input to the digital input port 76 of the microprocessor 70. Thus, the microprocessor 70 can determine whether the output terminal voltage VD is at the high potential level (≅the power supply potential VB) or at the low potential level (≅the ground potential GND) by determining whether the digital input port 76 is at the low level or the high level.

A method of detecting connection anomalies of the lead wires 54 and 55 which are connection paths for connecting the heater control circuit 50 (the heater driver 51) and the heater 4 is described as follows.

First, a case will be considered where the lead wire 55 (a second connection path) which connects the ground terminal 53 of the heater control circuit 50 and the heater terminal 4N (first end) of the heater 4 and grounds the heater terminal 4N is short-circuited to the ground potential GND in the midway of the path. The lead wire 55 is grounded to the ground potential GND through the ground terminal 53 from its one end. Therefore, even when the lead wire 55 short-circuits to the ground potential GND in the midway of the path, no difference arises between this state and a normal state from the viewpoint of the electrical circuit. Therefore, in the present embodiment, this state is excluded from the states to be detected.

Also, a case will be considered where the lead wire 55 is short-circuited to the power supply potential VB. In this case, since a short circuit is formed between the power supply potential VB and the ground potential GND, an overcurrent anomaly occurs on the power supply side irrespective of the drive of the heater 4 by the heater driver 51. Therefore, in the present embodiment, this state is also excluded from the states to be detected.

As described above, in the gas sensor control apparatus 1 of the present embodiment, short-circuiting of the lead wire 55 (the second connection path) to the ground potential GND or the power supply potential VB is not detected.

Figure 2A:
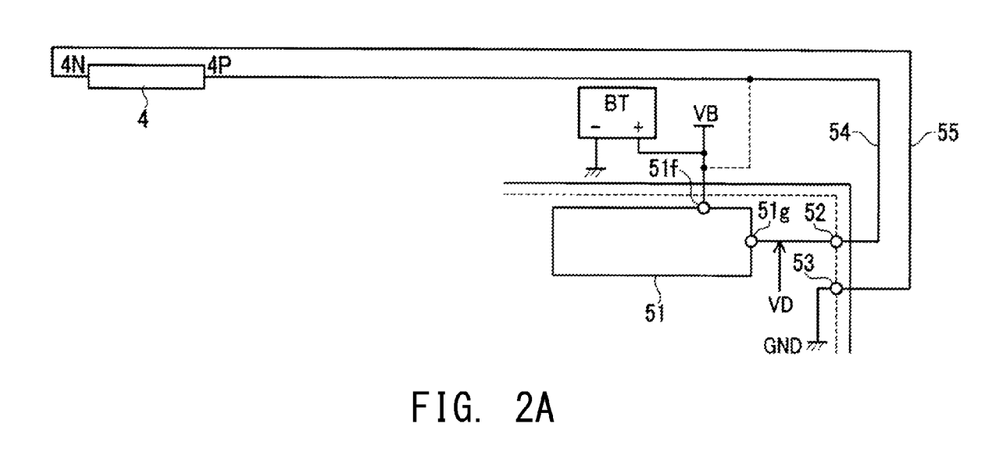
FIGS. 2A and 2B are explanatory diagrams showing the case where a lead wire communicating with a heater is short-circuited to a power supply potential and the case where the lead wire communicating with the heater is short-circuited to a ground potential for the gas sensor control apparatus according to the embodiment.
Figure 2B:
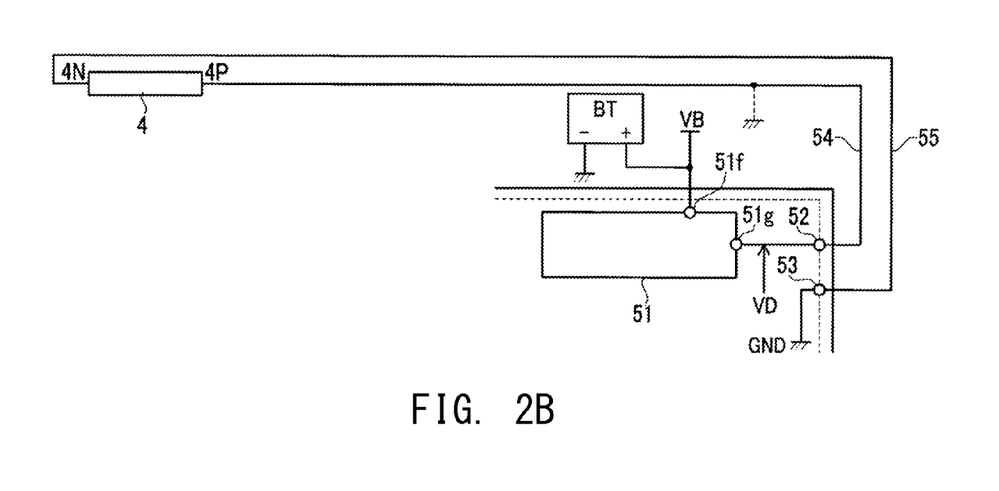

Next, a case will be considered where the lead wire 54 (a first connection path) which connects the output terminal 52 of the heater control circuit 50 and the heater terminal 4P (second end) of the heater 4 is short-circuited to the ground potential GND (short-to-ground) as shown by a broken line in FIG. 2B. In this case, even when the FET 51a of the heater driver 51 is turned on and off, the output terminal voltage VD of the output terminal 52 is fixed to and remains at the ground potential GND. At that time, since the FET 57a of the level conversion circuit 57 remains in the off state, the input level of the digital input port 76 does not change from the high level. Namely, in this case, the output terminal voltage VD detected by the microprocessor 70 remains at the low potential level (□ the ground potential GND) which is the level that the output terminal voltage VD assumes when the heater driver 51 is turned off.

Meanwhile, a case will be considered where the lead wire 54 (the first connection path) is short-circuited to the power supply potential VB (short-to-power) as shown by a broken line in FIG. 2A. In this case, even when the FET 51a of the heater driver 51 is turned on and off, the output terminal voltage VD of the output terminal 52 is fixed to and remains at the power supply potential VB. At that time, since the FET 57a of the level conversion circuit 57 remains in the on state, the input level of the digital input port 76 does not change from the low level. Namely, in this case, the output terminal voltage VD detected by the microprocessor 70 remains at the high potential level (≅the power supply potential VB) which is the level that the output terminal voltage VD assumes when the heater driver 51 is turned on.

Next, a case will be considered where one of the lead wire 54 (the first connection path) and the lead wire 55 (the second connection path) is broken. In this case, when the microprocessor 70 turns the FET 51a of the heater driver 51 on and off by outputting the PWM pulse signal PS1 from the PWM output port 74, in synchronism with a change in the PWM pulse signal PS1, the output terminal voltage VD of the output terminal 52 repeatedly changes between the high potential level (≅the power supply potential VB) which is the level at which the heater driver 51 turns on and the low potential level (≅the ground potential GND) which is the level at which the heater driver 51 turns off. However, in the case where the lead wire 54 or the lead wire 55 is broken, since no current flows through the heater 4, and only a very small current flowing through the resistors R3 and R4, etc. flows through the FET 51a of the heater driver 51. Therefore, the magnitude of the sensing current Is flowing from the current sensing circuit 51d to the external current sensing resistor Rs; i.e., the magnitude of the voltage drop Vrs (=Rs×Is) input to the A/D input port 75, becomes very small, as compared with the normal case where wire breakage has not occurred.

Accordingly, by means of previously setting a lower limit current value Imin for the current flowing to the heater 4 through the heater driver 51 when the heater driver 51 turns on, it becomes possible to find that one of the lead wires 54 and 55 is broken when the magnitude of the current flowing through the heater driver 51 detected through the A/D input port 75 is smaller than the lower limit current value Imin.

In view of the above, in this gas sensor control apparatus 1, when the microprocessor 70 outputs the PWM pulse signal PS1 from the PWM output port 74 to thereby turn the heater driver 51 on and off; i.e., in a state in which the heater driver 51 energizing the heater 4 by pulses is repeatedly tuned on and off, the level of the output terminal voltage VD detected through the digital input port 76 and the magnitude of the current flowing through the heater driver 51 detected through the A/D input port 75 are used to detect connection anomalies of the lead wire 54 (the first connection path) and the lead wire 55 (the second connection path). Specifically, in the case where the level of the digital input port 76 repeatedly changes between the high level and the low level (i.e., the level of the output terminal voltage VD changes between the high potential level and the low potential level) and the magnitude of the current flowing to the heater 4 through the heater driver 51, which current is detected through the A/D input port 75, is smaller than the lower limit current value Imin (0.4 A in the present embodiment), the microprocessor 70 judges that one of the lead wire 54 (the first connection path) and the lead wire 55 (the second connection path) is broken. Also, in the case where the level of the digital input port 76 remains at the low level (i.e., where the detected level of the output terminal voltage VD remains at the high potential level), the microprocessor 70 judges that the lead wire 54 (the first connection path) suffers a short-to-power anomaly; i.e., the lead wire 54 (the first connection path) is short-circuited to the power supply potential VB. Further, in the case where the level of the digital input port 76 remains at the high level (i.e., where the detected level of the output terminal voltage VD remains at the low potential level), the microprocessor 70 judges that the lead wire 54 (the first connection path) suffers a short-to-ground anomaly; i.e., the lead wire 54 (the first connection path) is short-circuited to the ground potential GND.

In addition, when the microprocessor 70 judges that any of these connection anomalies has occurred, the microprocessor 70 stops the supply of electric current to the heater 4 and causes the pump current control circuit 47 of the sensor element section control circuit 40 to stop the supply of the pump current Ip to the pump cell 14 of the sensor element section 3, to thereby stop the drive of the sensor element section 3.

Figure 3A:
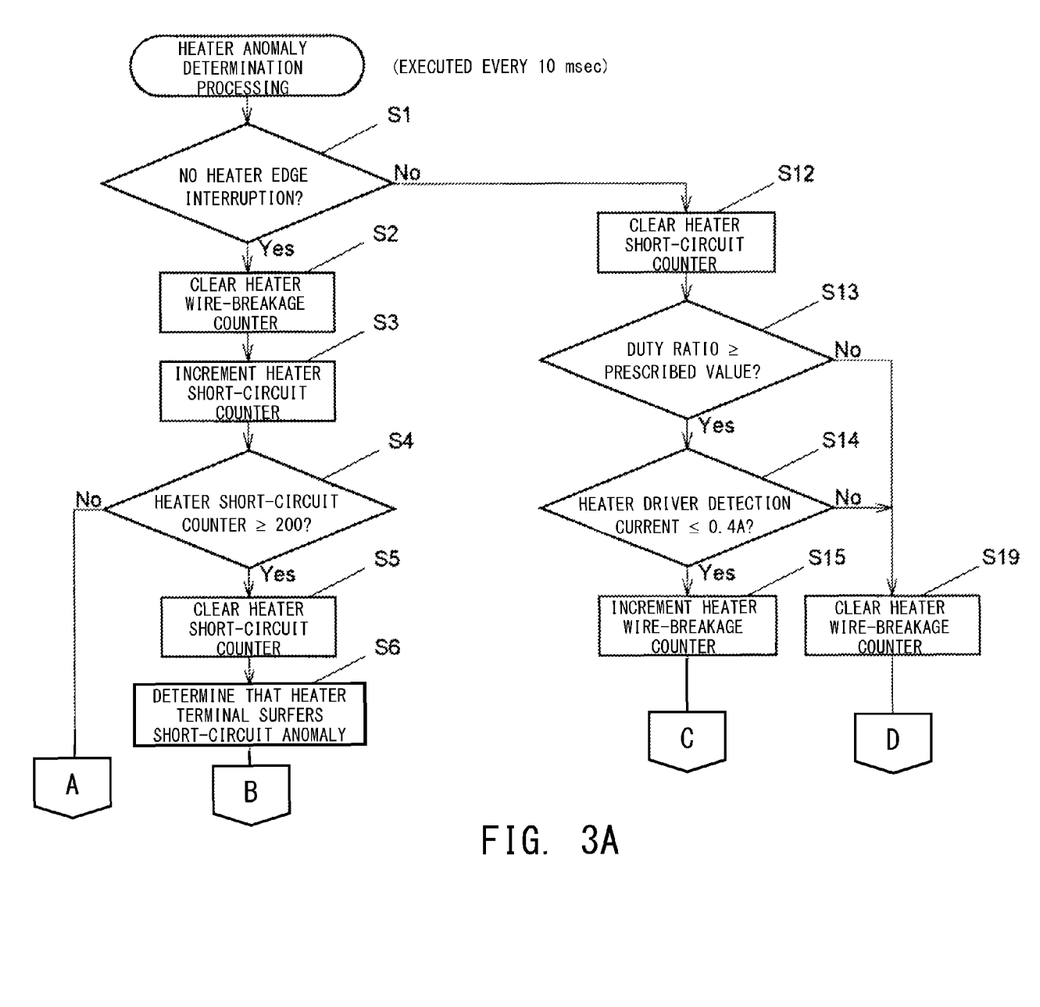
FIGS. 3A and 3B are flowcharts showing operation of a microprocessor of the gas sensor control apparatus according to the embodiment.
Figure 3B:
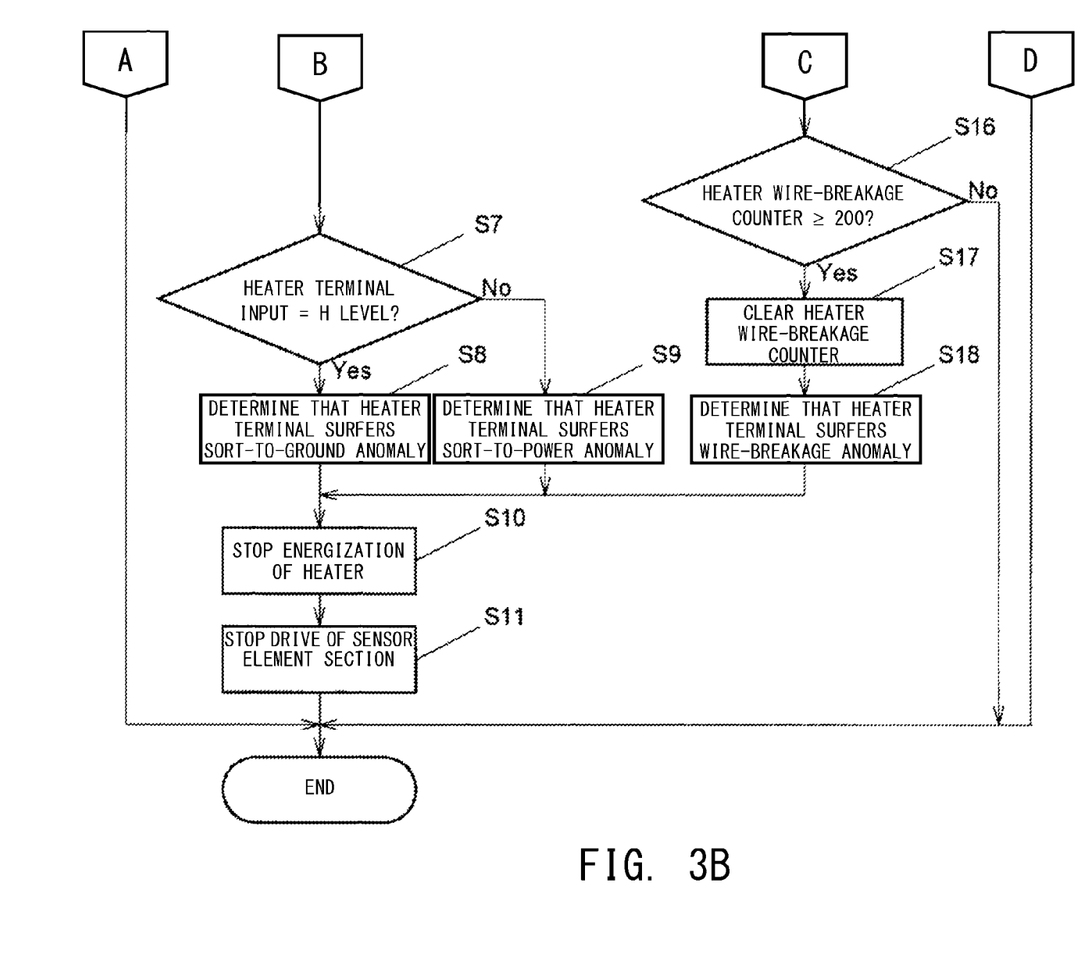

Next, with reference to FIGS. 3A and 3B, a method is specifically described by which the gas sensor control apparatus 1 of the present embodiment detects connection anomalies of the connection paths (the lead wires 54, 55) which connect the heater control circuit 50 (the heater driver 51) and the heater 4.

FIGS. 3A and 3B are flowcharts showing the operation of the gas sensor microprocessor 70 of the control apparatus 1 according to the first embodiment at the time when the gas sensor microprocessor 70 detects a connection anomaly of the lead wires 54 and 55.

The microprocessor 70 outputs the PWM pulse signal PS1 (the period T=10 msec) from the PWM output port 74 so as to start the supply of electric current to the heater 4. During a period during which the microprocessor 70 energizes the heater 4 by supplying pluses thereto; i.e., the microprocessor 70 outputs the PWM pulse signal PS1, in order to detect connection anomalies of the lead wires 54 and 55, the microprocessor 70 executes a heater anomaly determination processing routine shown in FIGS. 3A and 3B, at intervals of 10 msec, in synchronism with the rising of the PWM pulse signal PS1.

First, in step S1, the microprocessor 70 determines whether or not the level of the output terminal voltage VD at the output terminal 52 of the heater control circuit 50 (at the output terminal 51g of the heater driver 51) has changed by determining whether or not a heater edge interruption has been generated as a result of changing the input level of the digital input port 76 of the microprocessor 70 between the high level and the low level. When a heater edge interruption is absent (Yes), the microprocessor 70 proceeds to step S2. When a heater edge interruption is present (No), the microprocessor 70 proceeds to step S12.

In step S2, the microprocessor 70 clears a heater wire breakage counter used in the processing performed in step S12 and steps subsequent thereto when the heater edge interruption is present. In step S3 subsequent thereto, the microprocessor 70 increments (increases by one) a heater short-circuit counter used in the processing performed in step S2 and steps subsequent thereto when the heater edge interruption is absent.

Next, in step S4, the microprocessor 70 determines whether or not the value of the heater short-circuit counter is equal to or greater than 200; i.e., determines whether or not an anomalous state in which the heater edge interruption is not generated continues for 2 seconds.

In the case where the value of the heater short-circuit counter is equal to or greater than 200 (Yes), the microprocessor 70 proceeds to step S5. Meanwhile, in the case where the value of the heater short-circuit counter is less than 200 (No), the microprocessor 70 ends the present execution of the heater anomaly determination processing and waits for elapse of 10 msec so as to execute the heater anomaly determination processing again.

In step S5, the microprocessor 70 clears the value of the heater short-circuit counter having reached 200. In step S6 subsequent thereto, the microprocessor 70 determines that the lead wire 54 connected to the heater terminal 4P suffers a short-circuit anomaly (short-to-ground anomaly or short-to-power anomaly).

Next, in step S7, the microprocessor 70 determines the input level of the digital input port 76. The input level assumes a high level or a low level depending on the output terminal voltage VD of the output terminal 52 to which the heater terminal 4P is connected through the lead wire 54. In the case where the input level of the digital input port 76 is at the high level; i.e., where the output terminal voltage VD remains at the low potential level which is the level when the heater driver 51 turns off, the result of the judgment in step S7 becomes Yes, and the microprocessor 70 proceeds to step S8. In step S8, the microprocessor 70 determines that the lead wire 54 connected to the heater terminal 4P suffers a short-to-ground anomaly.

Meanwhile, in the case where the input level of the digital input port 76 is at the low level; i.e., where the output terminal voltage VD remains at the high potential level which is the level when the heater driver 51 turns on, the result of the judgment in step S7 becomes No, and the microprocessor 70 proceeds to step S9. In step S9, the microprocessor 70 determines that the lead wire 54 connected to the heater terminal 4P suffers a short-to-power anomaly.

After determining in step S8 or step S9 that a short-to-ground anomaly or a short-to-power anomaly has occurred, the microprocessor 70 proceeds to step S10. In step S10, the microprocessor 70 switches the output of the PWM output port 74 to the low level so as to stop the output of the PWM pulse signal PS1, to thereby stop the supply of electric current to the heater 4 by the heater driver 51. Next, in step S11, the microprocessor 70 causes the pump current control circuit 47 of the sensor element section control circuit 40 to stop the supply of pump current Ip to the pump cell 14 of the sensor element section 3, to thereby stop the drive of the sensor element section 3. Subsequently, the microprocessor 70 ends this heater anomaly determination processing.

In the case where the result of the determination in step S1 is No and the microprocessor 70 proceeds to step S12, the microprocessor 70 clears the value of the heater short-circuit counter in step S12.

Next, in step S13, the microprocessor 70 determines whether or not the duty ratio of the pulse voltage PS applied to the heater 4 (the duty ratio of the PWM pulse signal PS1) is equal or greater than a prescribed value. In the case where the duty ratio is less than the prescribed value (No); i.e., where the duty ratio is not large enough to detect the magnitude of the current flowing through the heater driver 51, the microprocessor 70 proceeds to step S19 to clear the value of the heater wire breakage counter. After that, the microprocessor 70 ends the present execution of the heater anomaly determination processing without performing an anomaly determination.

Meanwhile, in the case where the duty ratio is equal to or greater than the prescribed value (Yes); i.e., where the duty ratio is large enough to detect the magnitude of the current flowing through the heater driver 51, the microprocessor 70 proceeds to step S14.

In step S14, the microprocessor 70 determines whether or not the magnitude of the current flowing through the heater driver 51 is equal to or less than 0.4 A (=the lower limit current value Imin) by detecting, through the A/D input port 75, the magnitude of the sensing current Is flowing from the current sensing circuit 51d of the heater driver 51 to the external current sensing resistor Rs.

In the case where the magnitude of the current flowing through the heater driver 51 is neither equal to nor less than 0.4 A (exceeds 0.4 A) (No), the proper current is considered to flow to the heater 4. Therefore, it is assumed that the heater 4 does not suffer wire breakage. In view of the above, after clearing the value of the heater wire breakage counter in step S19, the microprocessor 70 ends the heater anomaly determination processing.

Meanwhile, in the case where the magnitude of the current flowing through the heater driver 51 is equal to or less than 0.4 A, the result of the determination in step S14 becomes Yes, and the microprocessor 70 proceeds to step S15 so as to increment (increase by one) the value of the heater wire breakage counter. This is because the proper current is considered to not flow to the heater 4.

Next, in step S16, the microprocessor 70 determines whether or not the value of the heater wire-breakage counter is equal to or greater than 200; i.e., determines whether or not an anomaly of heater wire breakage continues for 2 seconds. In the case where the value of the heater wire-breakage counter is equal to or greater than 200 (Yes), the microprocessor 70 proceeds to step S17. Meanwhile, in the case where the value of the heater wire-breakage counter is less than 200 (No), the microprocessor 70 ends the present execution of the heater anomaly determination processing and waits for elapse of 10 msec so as to execute the heater anomaly determination processing again.

In step S17, the microprocessor 70 clears the value of the heater wire-breakage counter having reached 200. In step S18 subsequent thereto, the microprocessor 70 determines that the lead wires 54 and 55 connected to the heater terminals 4P and 4N suffer a wire-breakage anomaly.

After that, as in the case where the microprocessor 70 determines that a short-to-ground anomaly or a short-to-power anomaly has occurred, the microprocessor 70 proceeds to step S10 so as to stop the supply of electric current to the heater 4 by the heater driver 51, and then proceeds to step S11 so as to cause the pump current control circuit 47 of the sensor element section control circuit 40 to stop the supply of pump current Ip to the pump cell 14 of the sensor element section 3, to thereby stop the drive of the sensor element section 3. Subsequently, the microprocessor 70 ends the heater anomaly determination processing.

In the present embodiment, the level conversion circuit 57, the digital input port 76 of the microprocessor 70, and the microprocessor 70 which executes steps S1 and S7 correspond to the level detection means of the invention.

The current sensing circuit 51d of the heater driver 51, the current sensing resistor Rs, the resistor R2, the A/D input port 75 of the microprocessor 70, and the microprocessor 70 which executes step S14 correspond to the current detection means of the invention.

The microprocessor 70 which executes steps S8, S9, and S18 corresponds to the anomaly detection means and the energization period anomaly detection means of the invention. The microprocessor 70 which executes step S8 corresponds to the ground-to-short determination means, the microprocessor 70 which executes step S9 corresponds to the ground-to-power determination means, and the microprocessor 70 which executes step S18 corresponds to the wire breakage determination means of the invention.

The microprocessor 70 which executes step S10 corresponds to the energization stoppage means, and the microprocessor 70 which executes step S11 corresponds to the element drive stoppage means and the pump current stoppage means of the invention.

As described above, in the gas sensor control apparatus 1 (the load drive apparatus) of the present embodiment, based on the level of the output terminal voltage VD detected by the level detection means and the current flowing to the heater 4 through the heater driver 51 detected by the current detection means, the anomaly detection means (steps S8, S9, and S18) detects three types of connection anomalies (wire breakage anomaly, short-to-power anomaly, and short-to-ground anomaly) of the connection paths (the lead wires 54 and 55) connecting the heater driver 51 (the pulse drive circuit) and the heater 4 (the resistive load). Namely, in the gas sensor control apparatus 1, the response of the output terminal voltage VD when the heater driver 51 is turned on and off is detected by the level detection means (steps S1 and S7), and the current flowing to the heater 4 when the heater driver 51 turns on is detected by the current detection means (step S14). Thus, the three types of connection anomalies can be detected properly using the response of the output terminal voltage VD and the current flowing to the heater 4.

In the gas sensor control apparatus 1 (the load drive apparatus) of the present embodiment, in the case where a heater edge interruption is generated in step S1 (i.e., where the level of the output terminal voltage VD changes between the high potential level and the low potential level) and the current flowing through the heater driver 51 detected in step S14 is smaller than the predetermined lower limit current value Imin (0.4 A in the present embodiment), a wire breakage anomaly is determined to have occurred; i.e., at least one of the lead wire 54 (the first connection path) and the lead wire 55 (the second connection path) suffers wire breakage (the wire breakage determination means: step S18).

Also, in the case where the level of the output terminal voltage VD remains at the high potential level; i.e., in the case where no heater edge interruption is generated in step S1 and the level of the digital input port 76 is the low level in step S7, a short-to-power anomaly is determined to have occurred; i.e., the lead wire 54 (the first connection path) connecting the output terminal 52 and the heater terminal 4P of the heater 4 (the resistive load) is short-circuited to the power supply potential VB (the short-to-power determination means: step S9).

Further, in the case where the level of the output terminal voltage VD remains at the low potential level; i.e., in the case where no heater edge interruption is generated in step Si and the level of the digital input port 76 is the high level in step S7, a short-to-ground anomaly is determined to have occurred; i.e., the lead wire 54 is short-circuited to the ground potential GND (the short-to-ground determination means: step S8).

By virtue of this processing, a wire breakage anomaly, a short-to-power anomaly, and a short-to-ground anomaly can be determined easily without fail, whereby the three types of connection anomalies can be detected properly.

In the gas sensor control apparatus 1 (the load drive apparatus) of the present embodiment, the three types of connection anomalies (wire breakage anomaly, short-to-power anomaly, and short-to-ground anomaly) are detected by turning on and off the heater driver 51 performing pulse energization. Therefore, it is unnecessary to separately perform energization dedicated for detection of the connection anomalies. In addition, it is possible to detect connection anomalies at an early stage during an ordinary period during which the heater 4 is energized by applying pulses thereto, without interrupting the energization.

In the gas sensor control apparatus 1 (the load drive apparatus) of the present embodiment, when a connection anomaly (wire breakage anomaly, short-to-power anomaly, or short-to-ground anomaly) at the lead wires 54, 55 connected to the heater 4 (the resistive load) is detected, the energization stoppage means (step S10) stops the supply of electric current to the heater 4 (the resistive load) by the heater driver 51.

Since the supply of electric current to the heater 4 is not continued in a state in which a connection anomaly has occurred, breakage of the heater driver 51 and the heater 4 can be prevented.

In the gas sensor control apparatus 1 (the load drive apparatus) of the present embodiment, when a connection anomaly at the lead wires 54, 55 is detected, the supply of electric current to the heater 4 is stopped, and the drive of the sensor element section 3 of the gas sensor 2 is stopped by the element drive stoppage means (step S11).

Therefore, it becomes possible to avoid a situation in which the sensor element section 3 of the gas sensor 2 becomes anomalous as a result of the sensor element section 3 of the gas sensor 2 being continuously driven in a state in which the sensor element section 3 is not heated properly.

In the gas sensor control apparatus 1 (the load drive apparatus) of the present embodiment, when a connection anomaly at the lead wires 54, 55 is detected, the supply of pump current Ip to the pump cell 14 is stopped by the pump current control circuit 47 of the sensor element section control circuit 40 (the element drive circuit). Therefore, the supply of pump current Ip to the pump cell 14 in a non-active state is not continued, whereby blackening of the pump cell 14 can be avoided.

The present invention has been described based on the above embodiment. However, the present invention is not limited thereto, and may be modified freely within the scope of the invention.

For example, in the embodiment, the gas sensor 2 which is an air-fuel ratio sensor (full-range oxygen sensor) for detecting the oxygen concentration of exhaust gas (air-fuel ratio) is used as a sensor having a gas detection element including a pump cell. However, the sensor having a gas detection element including a pump cell is not limited to an air-fuel ratio sensor, and the load drive apparatus and the sensor control apparatus of the present invention may be applied to an NOx sensor for detecting the nitrogen oxide (NOx) concentration of exhaust gas.

Also, the load drive apparatus and the sensor control apparatus of the present invention may be applied to a gas sensor which does not include a pump cell, for example, an oxygen sensor for detecting the richness (lean/rich) of oxygen.

In the embodiment, the resistive load is a heater for heating the detection element of a gas sensor. However, other examples of the resistive load include a heater for heating a fluid, a heater of a glow plug, and a heater which is applied to a particulate sensor for detecting particulates such as soot and which removes particulates adhering to the sensor upon application of heat. The load drive apparatus of the present invention may be applied to these heaters.

In the embodiment, an IPD including the current sensing circuit 51d is used as the heater driver 51. Thus, the current sensing circuit 51d contained in the IPD is used as a current detection means. However, means for detecting the current flowing to the heater 4 from a voltage drop across a current detection resistor connected in series to the heater 4 may be used as the current detection means.

In the embodiment, the level detection means is a means for converting the output terminal voltage VD to a binary value which changes between high and low levels by the level conversion circuit 57, inputting the binary value to the digital input port 76 of the microprocessor 70, and determining whether the output terminal voltage VD is at the high potential level or the low potential level. However, the level detection means may be a means for measuring the potential of the output terminal voltage VD by A/D conversion and determining whether the output terminal voltage VD is at the high potential level or the low potential level.

The invention has been described in detail with reference to the above embodiments. However, the invention should not be construed as being limited thereto. It should further be apparent to those skilled in the art that various changes in form and detail of the invention as shown and described above may be made. It is intended that such changes be included within the spirit and scope of the claims appended hereto.

This application is based on Japanese Patent Application No. 2013-187232 filed Sep. 10, 2013, incorporated herein by reference in its entirety.

What is claimed is:

1. A load drive apparatus comprising:
a pulse drive circuit which has an output terminal connected to a second end of a resistive load whose first end is grounded, the pulse drive circuit being disposed between the resistive load and a power supply, the pulse drive circuit repeatedly applying a pulse voltage to the resistive load by repeatedly turning the pulse drive circuit on and off;
current detection means for detecting a current flowing from the power supply to the resistive load through the pulse drive circuit when the pulse drive circuit turns on;
level detection means for determining whether an output terminal voltage at the output terminal of the pulse drive circuit is at a high potential level or a low potential level; and
anomaly detection means for detecting a wire breakage anomaly, a short-to-power anomaly, and a short-to-ground anomaly based on the level of the output terminal voltage detected by the level detection means and the current detected by the current detection means when the pulse drive circuit is turned on and off,
the wire breakage anomaly being an anomaly in which at least one of a first connection path which connects the output terminal of the pulse drive circuit and the second end of the resistive load and a second connection path which grounds the first end of the resistive load is broken,
the short-to-power anomaly being an anomaly in which the first connection path is short-circuited to a power supply potential, and
the short-to-ground anomaly being an anomaly in which the first connection path is short-circuited to a ground potential.

2. The load drive apparatus as claimed in claim 1, wherein the anomaly detection means includes:
wire-breakage determination means for determining that a wire breakage anomaly has occurred, when the level of the output terminal voltage changes between the high potential level and the low potential level as a result of turning the pulse drive circuit on and off, and the current flowing to the resistive load detected by the current detection means when the pulse drive circuit is turned on is smaller than a predetermined lower limit current value;
short-to-power determination means for determining that a short-to-power anomaly has occurred, when the level of the output terminal voltage remains at the high potential level irrespective of turning the pulse drive circuit on and off; and
short-to-ground determination means for determining that a short-to-ground anomaly has occurred, when the level of the output terminal voltage remains at the low potential level irrespective of turning the pulse drive circuit on and off.

3. The load drive apparatus as claimed in claim 1, wherein the anomaly detection means comprises energization period anomaly detection means for detecting a wire breakage anomaly, a short-to-power anomaly, and a short-to-ground anomaly by turning the pulse drive circuit on and off during a pulse energization period during which the pulse voltage is repeatedly applied to the resistive load.

4. The load drive apparatus as claimed in claim 1, further comprising energization stoppage means for stopping the supply of electric current to the resistive load by the pulse drive circuit when the anomaly detection means detects any of a wire breakage anomaly, a short-to-power anomaly, and a short-to-ground anomaly.

5. A sensor control apparatus which comprises the load drive apparatus as claimed in claim 4, said sensor control apparatus controlling a sensor including a heater which is the resistive load and which generates heat when energized by the load drive apparatus and a detection element formed of solid electrolyte and heated by the heater, the sensor control apparatus comprising:
an element drive circuit for driving the detection element of the sensor; and
element drive stoppage means for stopping the drive of the detection element by the element drive circuit when the anomaly detection means of the load drive apparatus detects any of a wire breakage anomaly, a short-to-power anomaly, and a short-to-ground anomaly.

6. The sensor control apparatus according to claim 5, wherein the sensor is a gas sensor which has, as the detection element, a gas detection element including a pump cell which is formed of an oxygen-ion-conductive solid electrolyte and pumps oxygen into or out of a measurement chamber of the gas detection element in accordance with a pump current flowing through the pump cell;
the element drive circuit includes a pump current control circuit for supplying the pump current to the pump cell; and
the element drive stoppage means includes pump current stoppage means for causing the pump current control circuit to stop the supply of the pump current to the pump cell.

* * * * *